United States Patent
Chung

(10) Patent No.: US 11,631,469 B2
(45) Date of Patent: Apr. 18, 2023

(54) INTEGRATED CIRCUIT AND TEST METHOD THEREOF

(71) Applicant: SK hynix Inc., Icheon-si (KR)

(72) Inventor: Seung Hyun Chung, Icheon-si (KR)

(73) Assignee: SK hynix Inc., Icheon-si (KR)

(*) Notice: Subject to any disclaimer, the term of this patent is extended or adjusted under 35 U.S.C. 154(b) by 115 days.

(21) Appl. No.: 17/147,238

(22) Filed: Jan. 12, 2021

(65) Prior Publication Data
US 2022/0068417 A1 Mar. 3, 2022

(30) Foreign Application Priority Data

Aug. 25, 2020 (KR) .......................... 10-2020-0107399

(51) Int. Cl.
*G11C 29/12* (2006.01)
*G11C 29/18* (2006.01)

(52) U.S. Cl.
CPC ........ *G11C 29/12005* (2013.01); *G11C 29/18* (2013.01)

(58) Field of Classification Search
None
See application file for complete search history.

(56) References Cited

U.S. PATENT DOCUMENTS

2013/0015915 A1\* 1/2013 Komatsu .......... G11C 29/12005
327/564
2016/0238655 A1\* 8/2016 Wang ........................ G06F 1/04

FOREIGN PATENT DOCUMENTS

KR 1020060135230 A 12/2006
KR 1020120089391 A 8/2012

\* cited by examiner

*Primary Examiner* — Guerrier Merant
(74) *Attorney, Agent, or Firm* — William Park & Associates Ltd.

(57) ABSTRACT

An integrated circuit includes a test control circuit, a driving circuit, and a test detection circuit. The test control circuit generates a test command signal and a test address signal corresponding to a test operation. The driving circuit performs the test operation by utilizing a test internal voltage, which is generated based on the test command signal. The test detection circuit compares the test address signal with target address information to output the test internal voltage.

9 Claims, 5 Drawing Sheets

| T_ADD | T_CMD |
|---|---|
| 0 | ERASE |
| 1 | PROGRAM INITIALIZATION |
| 2 | 1ST PROGRAM PULSE APPLICATION |
| 3 | 2ND PROGRAM PULSE APPLICATION |
| ⋮ | ⋮ |
| 13 | PROGRAM COMPLETION |
| 14 | READ |

INTEGRATED CIRCUIT AND TEST METHOD THEREOF

CROSS-REFERENCES TO RELATED APPLICATION

The present application claims priority under 35 U.S.C. § 119(a) to Korean application NO. 10:2020-0107399 filed on Aug. 25, 2020, in the Korean Intellectual Property Office, the disclosure of which is incorporated herein by reference in its entirety.

BACKGROUND

1. Technical Field

Various embodiments generally relate to an integrated circuit and a test method thereof, and more particularly, to an integrated circuit capable of detecting a test result according to a test operation and a test method of the integrated circuit.

2. Related Art

In general, various tests are performed on an integrated circuit, such as a semiconductor memory device, before it is released to market. Traditionally, Automatic Test Equipment (ATE) was utilized for a test operation on an integrated circuit. The automatic test equipment is a single product developed to determine whether an integrated circuit is well-designed. Because the cost of the automatic test equipment is relatively high, the cost of an integrated circuit depends on whether the integrated circuit is tested by the automatic test equipment. As it takes more time to test an integrated circuit with the automatic test equipment, the cost of the integrated circuit increases.

To solve the problem described above, more attention is being paid to built-in self-test circuits. A built-in self-test circuit is mounted within an integrated circuit and performs a test operation on the integrated circuit in lieu of automatic test equipment. The built-in self-test circuit reduces an amount of time otherwise used by the automatic test equipment and thus lowers the final cost of the integrated circuit.

However, built-in self-test circuits generally have complex configurations and require a great deal of space. A complex configuration causes susceptibility of a built-in self-test circuit to noise and can cause the built-in self-test circuit to output an erroneous test result value due to the noise. The requirement of increased space is a drawback to mounting a built-in self-test circuit within an integrated circuit.

SUMMARY

According to an embodiment, provided are an integrated circuit capable of detecting a test result according to a test operation with a minimum configuration and a test method of the integrated circuit.

According to an embodiment, provided are an integrated circuit capable of detecting an intermediate test result value occurring during a test operation on an integrated circuit and a test method of the integrated circuit.

In an embodiment, an integrated circuit may include a test control circuit, a driving circuit, and a test detection circuit. The test control circuit may be configured to generate a test command signal and a test address signal corresponding to a test operation. The driving circuit may be configured to perform the test operation by utilizing a test internal voltage, which is generated based on the test command signal. The test detection circuit may be configured to compare the test address signal with target address information to output the test internal voltage.

In an embodiment, an integrated circuit may include a test control circuit, a driving circuit, and a test detection circuit. The test control circuit may be configured to generate a test command signal and a test address signal corresponding to a test operation. The driving circuit may be configured to perform the test operation by utilizing a plurality of test internal voltages, which are generated based on the test command signal. The test detection circuit may be configured to compare the test address signal with target address information to output a test internal voltage corresponding to target voltage information among the plurality of test internal voltages.

In an embodiment, a test method of an integrated circuit may include: storing a test address signal and a test command signal for performing test operations; setting target address information corresponding to the test address signal in order to select a particular test operation among the test operations; setting target voltage information corresponding to each of a plurality of test internal voltages in order to select a particular test internal voltage among the plurality of test internal voltages, which are utilized during the particular test operation; and detecting at least one test internal voltage among the plurality of test internal voltages based on the target address information and the target voltage information.

According to an embodiment, a test result may be detected without utilizing automatic test equipment, and therefore, the cost of an integrated circuit may be lowered.

According to an embodiment, an intermediate test result value occurring during a test operation may be detected, and therefore, it may be possible to deeply analyze a test operation and reliability of a test result may be improved.

Objects of the present disclosure are not limited to the aforementioned objects, and other objects not described above may be evidently understood by those skilled in the art, to which the present disclosure pertains, from the following description.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe an order of the steps. The steps may be performed in an order different from the order described in the context unless a specific order is clearly described in the context. That is, the steps may be performed according to the described order, may be performed substantially at the same time as the described order, or may be performed in reverse order from the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Figure 1:
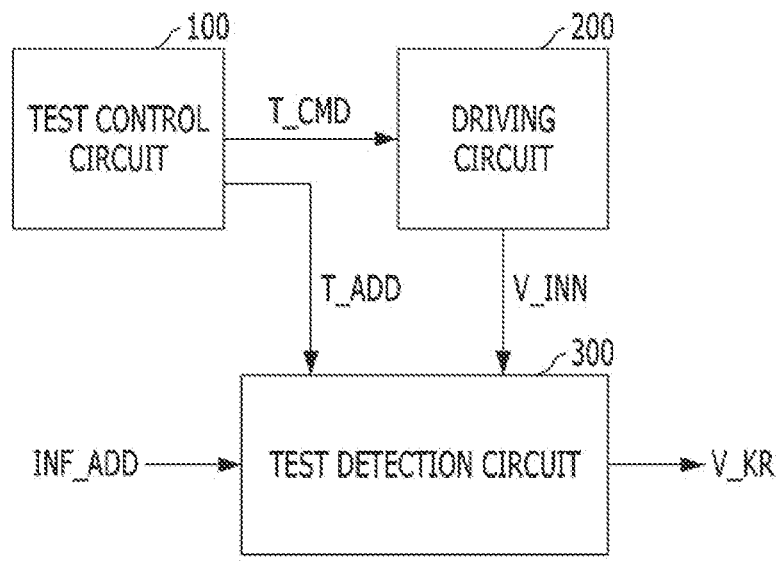
FIG. 1 is a block diagram illustrating a configuration of an integrated circuit according to an embodiment.

FIG. 1 is a block diagram illustrating a configuration of an integrated circuit according to an embodiment.

Referring to FIG. 1, the integrated circuit may include a test control circuit 100, a driving circuit 200, and a test detection circuit 300.

The test control circuit 100 may be configured to generate a test command signal T_CMD and a test address signal T_ADD corresponding to a test operation. For some embodiments, the test operation is a pre-set test operation. The test command signal T_CMD may be a signal corresponding to one among various test operations performed within the driving circuit 200. The test address signal T_ADD may be a flag signal indicating one among various test operations. The test command signal T_CMD and the test address signal T_ADD will be described with reference to FIG. 3.

The driving circuit 200 may be configured to perform the test operation based on the test command signal T_CMD. During the test operation, the driving circuit 200 may generate a test internal voltage V_INN and may perform the test operation by utilizing the test internal voltage V_INN. The test operation may be a main operation of a semiconductor memory device, such as an operation of storing data, reading stored data, and so forth.

The test detection circuit 300 may compare the test address signal T_ADD with target address information INF_ADD to output the test internal voltage V_INN as a test result value V_KR.

Through the configuration as described above, the integrated circuit according to an embodiment may perform a test operation for the driving circuit 200 based on the test command signal T_CMD. Also, the integrated circuit according to an embodiment may detect the test internal voltage V_INN, which is generated by the driving circuit 200, as the test result value V_KR based on the target address information INF_ADD.

Figure 2:
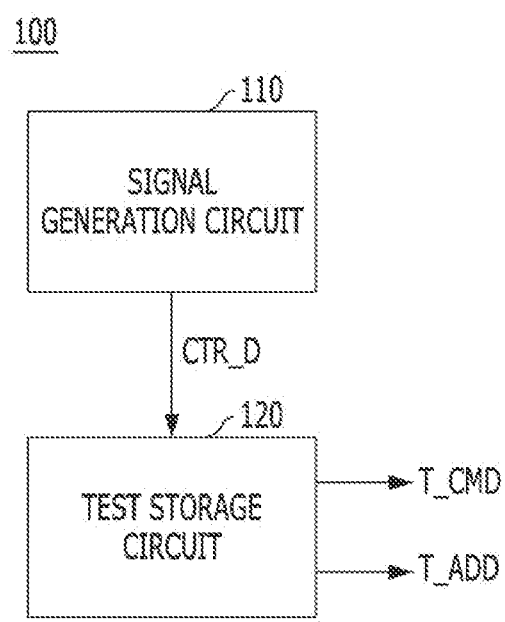
FIG. 2 is a block diagram illustrating a configuration of a test control circuit illustrated in FIG. 1.

FIG. 2 is a block diagram illustrating a configuration of the test control circuit 100 illustrated in FIG. 1.

Referring to FIG. 2, the test control circuit 100 may include a signal generation circuit 110 and a test storage circuit 120.

The signal generation circuit 110 may be configured to generate a control signal CTR_D for controlling the test operation. The test storage circuit 120 may be configured to store the test command signal T_CMD and the test address signal T_ADD. The test storage circuit 120 may be embodied with read-only memory (ROM). The test storage circuit 120 may store the test command signal T_CMD and the test address signal T_ADD before a test operation. The test storage circuit 120 may output the test command signal T_CMD and the test address signal T_ADD based on the control signal CTR_D output from the signal generation circuit 110.

Figures 3, 4:
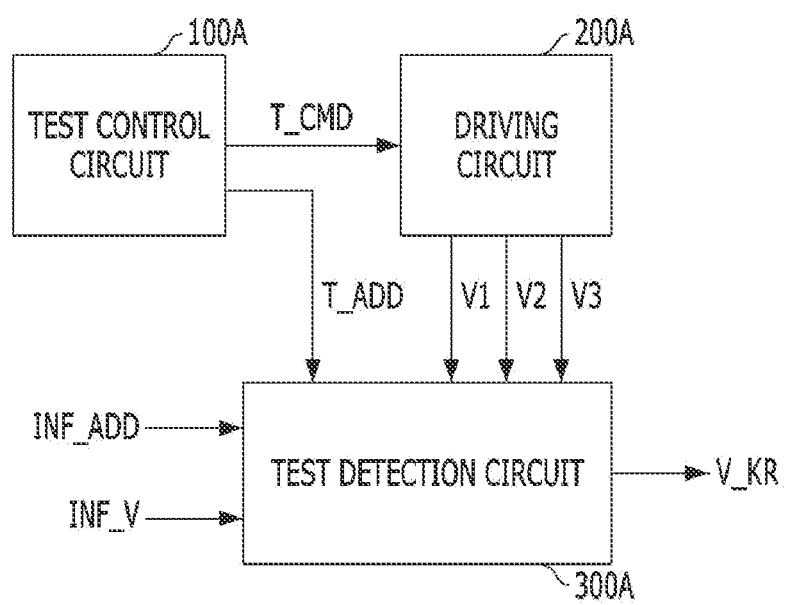
FIG. 3 is a table illustrating a relationship between a test address signal and a test command signal, which are stored in a test storage circuit illustrated in FIG. 2.
FIG. 4 is a block diagram illustrating a configuration of an integrated circuit according to an embodiment.

FIG. 3 is a table illustrating a relationship between the test address signal T_ADD and the test command signal T_CMD, which are stored in the test storage circuit 120 illustrated in FIG. 2.

According to an embodiment, the integrated circuit may be the NAND Flash memory device. The NAND Flash memory device may perform a program operation of storing data into a memory cell and may perform a read operation of reading out data stored in a memory cell. The NAND Flash memory device may perform an erase operation of erasing data stored in a memory cell before a program operation on the memory cell.

The test storage circuit 120 illustrated in FIG. 2 may generate the test command signal T_CMD and the test address signal T_ADD for each of an erase operation, a program operation, and a read operation of the NAND Flash memory device. The test storage circuit 120 may provide the test command signal T_CMD to the driving circuit 200. The test storage circuit 120 may provide the test address signal T_ADD to the test detection circuit 300. Hereinafter, for convenience of description, a number of the test address signals T_ADD may be defined as 15 and a number of the test command signals T_CMD may be defined as 15. The numbers of the test command signals T_CMD and the test address signals T_ADD may depend on a test operation to be set.

Referring to FIG. 3, the test command signal T_CMD corresponding to the test address signal T_ADD of '0' may indicate an 'erase' operation. Also, the test command signals T_CMD corresponding to the test address signals T_ADD of '1' to '13' may indicate a 'program' operation. Further, the test command signal T_CMD corresponding to the test address signal T_ADD of '14' may indicate a 'read' operation. The 'erase' operation may correspond to the single test address signal T_ADD of '0', and the 'read' operation may correspond to the single test address signal T_ADD of '14'. That is, a single test operation may correspond to a single test address signal T_ADD. The 'program' operation may correspond to 13 test address signals, namely T_ADD of '1' to '13'. That is, a single test operation may correspond to a plurality of the test address signals T_ADD.

Particularly, the 'program' operation may correspond to a plurality of the test address signals T_ADD. The test address signal T_ADD of '1' may correspond to the 'program initialization' operation within the 'program' operation. The test address signal TADD of '2' may correspond to the 'first program pulse application' operation within the 'program' operation. The test address signal T_ADD of '3' may correspond to the 'second program pulse application' operation within the 'program' operation. Although not illustrated, the test address signals T_ADD of '4' to '12' may correspond to particular operations within the 'program' operation. The test address signal T_ADD of '13' may correspond to the 'program completion' operation within the 'program' operation. The 'program completion' operation may correspond to the 'verify' operation.

Referring back to FIG. 2, the test storage circuit 120 may store the test command signal T_CMD and the test address signal T_ADD corresponding to each test operation. The test storage circuit 120 may sequentially output the test command signal T_CMD and the test address signal T_ADD based on the control signal CTR_D. Therefore, the driving circuit 200 illustrated in FIG. 1 may generate, during a test operation corresponding to each of the test address signals T_ADD of '0' to '14', the test internal voltage V_INN to perform the test operation. Particularly, the driving circuit 200 may generate the test internal voltage V_INN corresponding to the 'program' operation based on the test address signals T_ADD of '1' to '12'. Also, the test detection circuit 300 may detect, as an intermediate test result value for the 'program' operation, the test internal voltage V_INN based on each of the test address signals T_ADD of '1' to '12'.

According to an embodiment, the integrated circuit may detect the test internal voltage V_INN corresponding to the test address signal T_ADD. Therefore, a test operator may analyze by himself an internal operation of an integrated circuit through the test internal voltage V_INN. According to an embodiment, the integrated circuit may detect an intermediate test result value. Therefore, a test operator may more deeply analyze an integrated circuit.

FIG. 4 is a block diagram illustrating a configuration of an integrated circuit according to an embodiment.

Referring to FIG. 4, the integrated circuit may include a test control circuit 100A, a driving circuit 200A, and a test detection circuit 300A.

The test control circuit 100A may be configured to generate a test command signal T_CMD and a test address signal T_ADD corresponding to a test operation. For some embodiments, the test operation is a pre-set test operation.

The driving circuit 200A may be configured to perform the test operation by utilizing a plurality of test internal voltages, e.g., first, second, and third test internal voltages V1, V2, and V3, which are generated based on the test command signal T_CMD. The first, second, and third test internal voltages V1, V2, and V3 may include at least one test internal voltage that is utilized during an erase operation, a program operation, and a read operation.

The test detection circuit 300A may compare the test address signal T_ADD with target address information INF_ADD to output a test internal voltage corresponding to target voltage information INF_V among the plurality of test internal voltages, i.e., the first, second, and third test internal voltages V1, V2, and V3.

Through the configuration as described above, the integrated circuit according to an embodiment may selectively detect a particular test internal voltage among the plurality of test internal voltages, which are utilized during a particular test operation, based on the target address information INF_ADD and the target voltage information INF_V.

Figure 5:
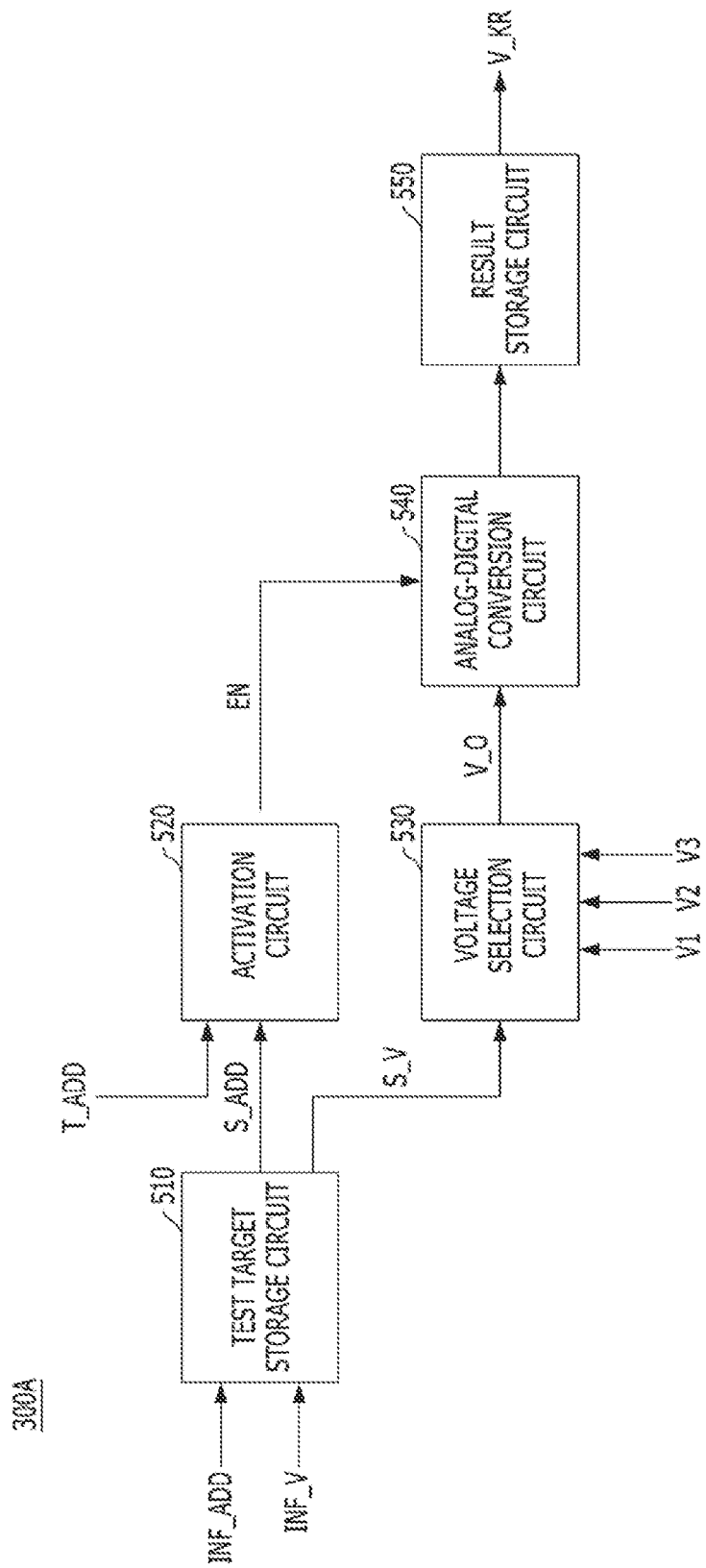
FIG. 5 is a block diagram illustrating a configuration of a test detection circuit illustrated in FIG. 4.

FIG. 5 is a block diagram illustrating a configuration of the test detection circuit 300A illustrated in FIG. 4.

Referring to FIG. 5, the test detection circuit 300A may include a test target storage circuit 510, an activation circuit 520, a voltage selection circuit 530, and an analog-digital conversion circuit 540.

The test target storage circuit 510 may receive and store therein the target address information INF_ADD and the target voltage information INF_V. The target address information INF_ADD may be information corresponding to a particular test operation. The target voltage information INF_V may be information corresponding to a particular test internal voltage among the plurality of test internal voltages, which are utilized during a particular test operation. The test target storage circuit 510 may output stored target address information S_ADD corresponding to the target address information INF_ADD and may output stored target voltage information S_V corresponding to the target voltage information INF_V.

The activation circuit 520 may be configured to compare the stored target address information S_ADD, which is output from the test target storage circuit 510, with the test address signal T_ADD to generate an activation signal EN. The activation circuit 520 may enable the activation signal EN when the stored target address information S_ADD and the test address signal T_ADD are the same as each other. The activation signal EN may be provided to the analog-digital conversion circuit 540 which will be described later.

The voltage selection circuit 530 may be configured to selectively output at least one among the first, second, and third test internal voltages V1, V2, and V3 based on the stored target voltage information S_V, which is output from the test target storage circuit 510. The stored target voltage information S_V may be a code-type signal corresponding to each of the first, second, and third test internal voltages V1, V2, and V3.

The analog-digital conversion circuit 540 may receive an output voltage V_O of the voltage selection circuit 530, and may covert the output voltage V_O into a digital type signal based on the activation signal EN. That is, the analog-digital conversion circuit 540 may convert the output voltage V_O, which is input therein as an analog type signal, into a digital type signal to output the digital type signal.

According to an embodiment, the integrated circuit may selectively detect a test internal voltage corresponding to the target voltage information INF_V among test internal voltages generated during a particular test operation corresponding to the target address information INF_ADD.

The test detection circuit 300A may further include a result storage circuit 550. The result storage circuit 550 may be configured to store a voltage value, which is output from the analog-digital conversion circuit 540. That is, the result storage circuit 550 may store a digital value for a test internal voltage corresponding to the target address information INF_ADD and the target voltage information INF_V. Therefore, a test operator may analyze an integrated circuit through the voltage value for the test internal voltage stored in the result storage circuit 550.

Figure 6:
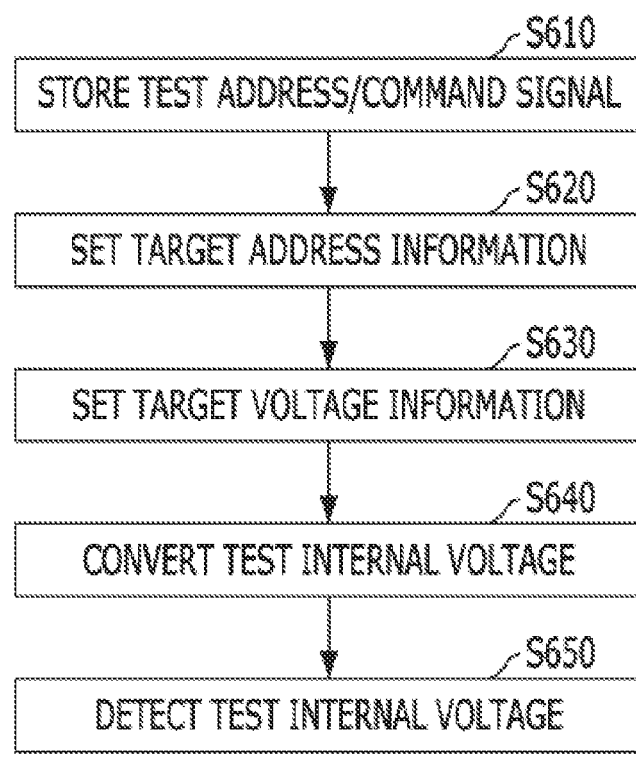
FIG. 6 is a flowchart illustrating a test method of the integrated circuit illustrated in FIG. 4.

FIG. 6 is a flowchart illustrating a test method of the integrated circuit illustrated in FIG. 4.

Referring to FIGS. 4 to 6, the test method of the integrated circuit may include steps of storing a test address/command signal (S610), setting target address information (S620), setting target voltage information (S630), converting a test internal voltage (S640), and detecting a test internal voltage (S650).

Step S610 of storing the test address/command signal may be a step of storing the test address signal T_ADD and the test command signal T_CMD for performing various test operations. Step S610 of storing the test address/command signal may include a step of storing the test address signal T_ADD and the test command signal T_CMD in the test storage circuit 120 illustrated in FIG. 2.

Step S620 of setting the target address information may be a step of setting the target address information INF_ADD corresponding to the test address signal T_ADD in order to select a particular test operation among the test operations. Step S620 of setting the target address information may include a step of storing the target address information INF_ADD into the test target storage circuit 510 illustrated in FIG. 5.

Step S630 of setting the target voltage information may be a step of setting the target voltage information INF_V corresponding to each of the plurality of test internal voltage in order to select a particular test internal voltage among the plurality of test internal voltages, which are utilized during the particular test operation. Step S630 of setting the target voltage information may include storing the target voltage information INF_V into the test target storage circuit 510 illustrated in FIG. 5. FIG. 5 exemplifies the first, second, and third test internal voltages V1, V2, and V3 as an example of the plurality of test internal voltages. For example, the test target storage circuit 510 may store the target voltage information INF_V including one among the first, second, and third test internal voltages V1, V2, and V3. Although it is exemplified to select one among a plurality of three test internal voltages V1, V2, and V3, it may be possible to select one among a different plurality of test internal voltages according to an embodiment.

Step S640 of converting the test internal voltage may be a step of converting a test internal voltage corresponding to the target voltage information INF_V. Step S640 of converting the test internal voltage may include a step of converting the output voltage V_O of an analog-type into a digital type signal in the analog-digital conversion circuit 540 illustrated in FIG. 5.

Step S650 of detecting the test internal voltage may be a step of detecting at least one test internal voltage among the plurality of test internal voltages based on the target address information INF_ADD and the target voltage information INF_V. Step S650 of detecting the test internal voltage may include a step of outputting, as a test result value V_KR, at least one test internal voltage among the first, second, and third test internal voltages V1, V2, and V3 based on the target address information INF_ADD and the target voltage information INF_V, the step being performed by the test detection circuit 300A illustrated in FIG. 4.

According to an embodiment, the integrated circuit may selectively detect a test internal voltage corresponding to the target voltage information INF_V among the plurality of test internal voltages, which are generated during a particular test operation corresponding to the target address information INF_ADD.

Figure 7:
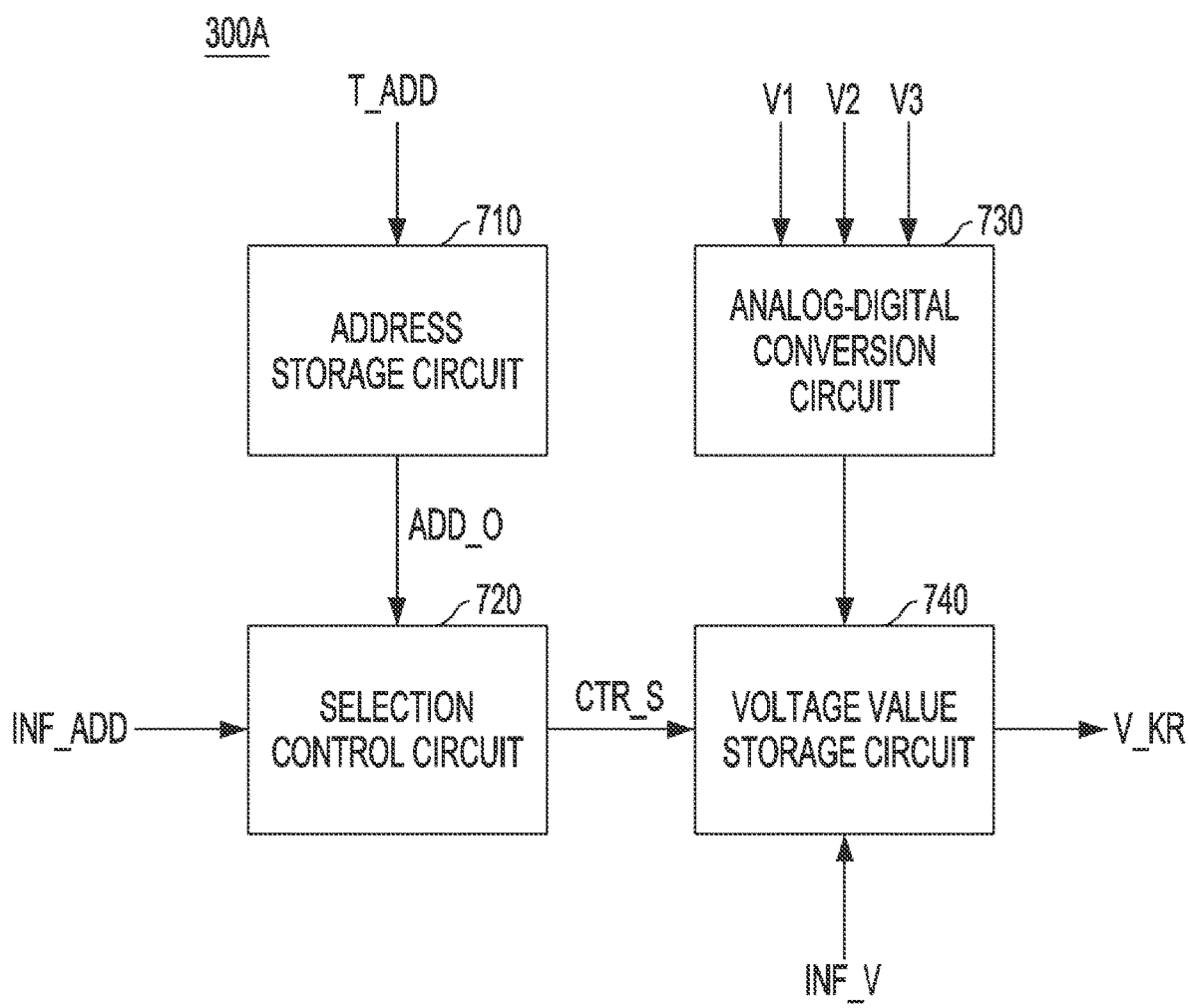
FIG. 7 is a block diagram illustrating a configuration of a test detection circuit illustrated in FIG. 4.

FIG. 7 is a block diagram illustrating a configuration of the test detection circuit 300A illustrated in FIG. 4.

Referring to FIG. 7, the test detection circuit 300A may include an address storage circuit 710, a selection control circuit 720, an analog-digital conversion circuit 730, and a voltage value storage circuit 740.

The address storage circuit 710 may be configured to store the test address signal T_ADD. The address storage circuit 710 may be configured with a plurality of registers. The plurality of registers may store the respective test address signals T_ADD, which are sequentially input.

The selection control circuit 720 may be configured to compare an output address signal ADD_O, which is output from the address storage circuit 710, with the target address information INF_ADD to generate a selection control signal CTR_S. When the test address signal T_ADD is the same as the target address information INF_ADD among the test address signals T_ADD stored in the address storage circuit 710, the selection control circuit 720 may output, as the selection control signal CTR_S, information corresponding to the register storing the test address signal T_ADD, which is the same as the target address information INF_ADD. For example, when the target address information INF_ADD is the same as the test address signal T_ADD stored in a third register within the address storage circuit 710, the selection control signal CTR_S may have information corresponding to the third register.

The analog-digital conversion circuit 730 may be configured to convert the first, second, and third test internal voltages V1, V2, and V3, which are the plurality of test internal voltages, into digital type signals. The first, second, and third test internal voltages V1, V2, and V3, which are output from the driving circuit 200A illustrated in FIG. 4, may be analog type signals. Therefore, the analog-digital conversion circuit 730 may convert the first, second, and third test internal voltages V1, V2, and V3, which are input as analog type signals, into digital type signals to output the digital type signal.

The voltage value storage circuit 740 may be configured to store an output value from the analog-digital conversion circuit 730. The voltage value storage circuit 740 may be configured by a plurality of registers, which is similar to the address storage circuit 710. The plurality of registers may store the respective output values, which are sequentially input from the analog-digital conversion circuit 730. Based on the selection control signal CTR_S and the target voltage information INF_V, the voltage value storage circuit 740 may be configured to output, as the test result value V_KR, at least one among the stored output values.

Hereinafter, described with reference to FIG. 7 will be a test method of the integrated circuit.

The driving circuit 200A illustrated in FIG. 4 may perform a test operation based on the test command signal T_CMD. The driving circuit 200A may generate the first, second, and third test internal voltages V1, V2, and V3 and provide the analog-digital conversion circuit 730 illustrated in FIG. 7 with the first, second, and third test internal voltages V1, V2, and V3. The analog-digital conversion circuit 730 may convert the first, second, and third test internal voltages V1, V2, and V3 into digital type signals. The voltage value storage circuit 740 may store the first, second, and third test internal voltages V1, V2, and V3, which are converted into the digital type signals, into the plurality of registers, respectively. The plurality of registers may be provided as an array, which is logically distinctive. A row in the array may indicate any among the first, second, and third test internal voltages V1, V2, and V3. A column in the array may indicate each test operation. Therefore, the voltage value storage circuit 740 may select a column in the array based on the target address information INF_ADD and may select a row in the array based on the target voltage information INF_V.

Hereinafter, for convenience of description, it is assumed that the target address information INF_ADD is the same as the test address signal T_ADD stored in a third register within the address storage circuit 710. In this case, according to a test operation corresponding to the third register within the address storage circuit 710, the first, second, and third test internal voltages V1, V2, and V3 may be stored in a third register within the voltage value storage circuit 740. Therefore, the voltage value storage circuit 740 may output, as the test result value V_KR, a test internal voltage among the first, second, and third test internal voltages V1, V2, and V3 based on the selection control signal CTR_S corresponding to the target address information INF_ADD and the target voltage information INF_V.

As described above, according to the embodiment of FIG. 7, the test result value V_KR may be output based on the target address information INF_ADD and the target voltage information INF_V, which is the same as the embodiment of FIG. 5. A test operator may analyze an integrated circuit through the test result value V_KR.

While certain embodiments have been described above, it will be understood by those skilled in the art that the embodiments described are by way of example only. Accordingly, the integrated circuit and test method thereof should not be limited based on the described embodiments. Rather, the integrated circuit and test method thereof described herein should only be limited in light of the claims that follow when taken in conjunction with the above description and accompanying drawings.

What is claimed is:

1. An integrated circuit comprising:
    a test control circuit configured to generate a test command signal and a test address signal corresponding to a test operation;
    a driving circuit configured to perform the test operation by utilizing a test internal voltage, which is generated based on the test command signal; and
    a test detection circuit configured to compare the test address signal with target address information to output the test internal voltage.

2. The integrated circuit of claim 1, wherein the test control circuit comprises:
    a signal generation circuit configured to generate a control signal for controlling the test operation; and
    a test storage circuit configured to store the test command signal and the test address signal and configured to output the test command signal and the test address signal based on the control signal.

3. The integrated circuit of claim 2, wherein the test storage circuit is configured to store at least one test address signal corresponding to at least one test operation.

4. An integrated circuit comprising:
    a test control circuit configured to generate a test command signal and a test address signal corresponding to a test operation;
    a driving circuit configured to perform the test operation by utilizing a plurality of test internal voltages, which are generated based on the test command signal; and
    a test detection circuit configured to compare the test address signal with target address information to output a test internal voltage corresponding to target voltage information among the plurality of test internal voltages.

5. The integrated circuit of claim 4, wherein the test control circuit comprises:
    a signal generation circuit configured to generate a control signal for controlling the test operation; and
    a test storage circuit configured to store the test command signal and the test address signal and configured to output the test command signal and the test address signal based on the control signal.

6. The integrated circuit of claim 5, wherein the test storage circuit is configured to store at least one test address signal corresponding to at least one test operation.

7. The integrated circuit of claim 4, wherein the test detection circuit comprises:
    a test target storage circuit configured to receive and store the target address information and the target voltage information;
    an activation circuit configured to compare the stored target address information, which is output from the test target storage circuit, with the test address signal to generate an activation signal;
    a voltage selection circuit configured to selectively output at least one test internal voltage among the plurality of test internal voltages based on the stored target voltage information, which is output from the test target storage circuit; and
    an analog-digital conversion circuit configured to receive the output voltage of the voltage selection circuit and covert the output voltage into a digital type signal based on the activation signal.

8. The integrated circuit of claim 7, further comprising a result storage circuit configured to store a voltage value, which is output from the analog-digital conversion circuit as the digital type signal.

9. The integrated circuit of claim 4, wherein the test detection circuit comprises:
    an address storage circuit configured to store the test address signal;
    a selection control circuit configured to compare an output address signal, which is output from the address storage circuit, with the target address information to generate a selection control signal;
    an analog-digital conversion circuit configured to convert the plurality of test internal voltages into digital type signals; and
    a voltage value storage circuit configured to store an output value from the analog-digital conversion circuit and output, as a test result value, at least one output value among the stored output values based on the selection control signal and the target voltage information.

* * * * *